United States Patent
Zhu et al.

(10) Patent No.: US 9,236,886 B1
(45) Date of Patent: Jan. 12, 2016

(54) UNIVERSAL AND RECONFIGURABLE QC-LDPC ENCODER

(71) Applicant: SanDisk Enterprise IP LLC, Milpitas, CA (US)

(72) Inventors: Jiangli Zhu, Sunnyvale, CA (US); Ying Yu Tai, Mountain View, CA (US); Xiaoheng Chen, San Jose, CA (US)

(73) Assignee: SANDISK ENTERPRISE IP LLC, Milpitas, CA (US)

( * ) Notice: Subject to any disclaimer, the term of this patent is extended or adjusted under 35 U.S.C. 154(b) by 72 days.

(21) Appl. No.: 14/029,697

(22) Filed: Sep. 17, 2013

Related U.S. Application Data

(60) Provisional application No. 61/801,394, filed on Mar. 15, 2013.

(51) Int. Cl.
| | |
|---|---|
| *H03M 13/11* | (2006.01) |
| *H03M 13/15* | (2006.01) |
| *H03M 13/53* | (2006.01) |

(52) U.S. Cl.
CPC .......... *H03M 13/15* (2013.01); *H03M 13/116* (2013.01); *H03M 13/1174* (2013.01)

(58) Field of Classification Search
CPC ... H03M 13/15; H03M 13/09; H03M 13/116; H03M 13/1174; H04L 1/0061; H04L 1/0057; H04L 1/0045; G06F 11/10; G06F 11/1076; G06F 11/1008
See application file for complete search history.

(56) References Cited

U.S. PATENT DOCUMENTS

| | | |
|---|---|---|
| 4,173,737 A | 11/1979 | Skerlos et al. |
| 4,888,750 A | 12/1989 | Kryder et al. |
| 4,916,652 A | 4/1990 | Schwarz et al. |

(Continued)

FOREIGN PATENT DOCUMENTS

| | | |
|---|---|---|
| EP | 1 299 800 | 4/2003 |
| EP | 1465203 A1 | 10/2004 |

(Continued)

OTHER PUBLICATIONS

Barr, Introduction to Watchdog Timers, Oct. 2001, 3 pgs.

(Continued)

*Primary Examiner* — April Y Blair
*Assistant Examiner* — Dipakkumar Gandhi
(74) *Attorney, Agent, or Firm* — Morgan, Lewis & Bockius LLP

(57) ABSTRACT

The various implementations described herein include systems, methods and/or devices that may enhance performance of error control encoding. The method includes receiving information data and generating parity information based on an m×k parity matrix comprising an array of b×b circulant sub-matrices, including m columns of said sub-matrices, each column comprising k said sub-matrices. The method further includes dividing the information data into a plurality of b-sized trunks and generating m parity segments. Each parity segment consists of b bits, and each parity segment is generated by multiplying each of the k b×b circulant sub-matrices in a respective column of the parity matrix by a corresponding trunk of information data, where each multiplication of a b×b circulant sub-matrix by a corresponding trunk comprises $b^2$ concurrent computations. The method further includes generating a codeword based on the information data and the m parity segments.

22 Claims, 9 Drawing Sheets

(56) References Cited

U.S. PATENT DOCUMENTS

| | | |
|---|---|---|
| 5,129,089 A | 7/1992 | Nielsen |
| 5,270,979 A | 12/1993 | Harari et al. |
| 5,329,491 A | 7/1994 | Brown et al. |
| 5,381,528 A | 1/1995 | Brunelle |
| 5,519,847 A | 5/1996 | Fandrich et al. |
| 5,530,705 A | 6/1996 | Malone, Sr. |
| 5,537,555 A | 7/1996 | Landry et al. |
| 5,551,003 A | 8/1996 | Mattson et al. |
| 5,636,342 A | 6/1997 | Jeffries |
| 5,657,332 A | 8/1997 | Auclair et al. |
| 5,666,114 A | 9/1997 | Brodie et al. |
| 5,708,849 A | 1/1998 | Coke et al. |
| 5,765,185 A | 6/1998 | Lambrache et al. |
| 5,890,193 A | 3/1999 | Chevallier |
| 5,936,884 A | 8/1999 | Hasbun et al. |
| 5,943,692 A | 8/1999 | Marberg et al. |
| 5,982,664 A | 11/1999 | Watanabe |
| 6,000,006 A | 12/1999 | Bruce et al. |
| 6,006,345 A | 12/1999 | Berry, Jr. |
| 6,016,560 A | 1/2000 | Wada et al. |
| 6,018,304 A | 1/2000 | Bessios |
| 6,044,472 A | 3/2000 | Crohas |
| 6,070,074 A | 5/2000 | Perahia et al. |
| 6,119,250 A | 9/2000 | Nishimura et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,295,592 B1 | 9/2001 | Jeddeloh |
| 6,311,263 B1 | 10/2001 | Barlow et al. |
| 6,408,394 B1 | 6/2002 | Vander Kamp et al. |
| 6,412,042 B1 | 6/2002 | Paterson et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,564,285 B1 | 5/2003 | Mills et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,865,650 B1 | 3/2005 | Morley et al. |
| 6,871,257 B2 | 3/2005 | Conley et al. |
| 6,895,464 B2 | 5/2005 | Chow et al. |
| 6,966,006 B2 | 11/2005 | Pacheco et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,028,165 B2 | 4/2006 | Roth et al. |
| 7,032,123 B2 | 4/2006 | Kane et al. |
| 7,043,505 B1 | 5/2006 | Teague et al. |
| 7,076,598 B2 | 7/2006 | Wang |
| 7,100,002 B2 | 8/2006 | Shrader |
| 7,102,860 B2 | 9/2006 | Wenzel |
| 7,111,293 B1 | 9/2006 | Hersh et al. |
| 7,126,873 B2 | 10/2006 | See et al. |
| 7,133,282 B2 | 11/2006 | Sone |
| 7,162,678 B2 | 1/2007 | Saliba |
| 7,173,852 B2 | 2/2007 | Gorobets et al. |
| 7,184,446 B2 | 2/2007 | Rashid et al. |
| 7,275,170 B2 | 9/2007 | Suzuki |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,533,214 B2 | 5/2009 | Aasheim et al. |
| 7,546,478 B2 | 6/2009 | Kubo et al. |
| 7,566,987 B2 | 7/2009 | Black et al. |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,765,454 B2 | 7/2010 | Passint |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,945,825 B2 | 5/2011 | Cohen et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich et al. |
| 7,996,642 B1 | 8/2011 | Smith |
| 8,006,161 B2 | 8/2011 | Lestable et al. |
| 8,032,724 B1 | 10/2011 | Smith |
| 8,041,884 B2 | 10/2011 | Chang |
| 8,042,011 B2 | 10/2011 | Nicolaidis et al. |
| 8,069,390 B2 | 11/2011 | Lin |
| 8,190,967 B2 | 5/2012 | Hong et al. |
| 8,250,380 B2 | 8/2012 | Guyot |
| 8,254,181 B2 | 8/2012 | Hwang et al. |
| 8,259,506 B1 | 9/2012 | Sommer et al. |
| 8,312,349 B2 | 11/2012 | Reche et al. |
| 8,412,985 B1 | 4/2013 | Bowers et al. |
| 8,429,436 B2 | 4/2013 | Fillingim et al. |
| 8,438,459 B2 | 5/2013 | Cho et al. |
| 8,453,022 B2 | 5/2013 | Katz |
| 8,627,117 B2 | 1/2014 | Johnston |
| 8,634,248 B1 | 1/2014 | Sprouse et al. |
| 8,694,854 B1 | 4/2014 | Dar et al. |
| 8,724,789 B2 | 5/2014 | Altberg et al. |
| 8,885,434 B2 | 11/2014 | Kumar |
| 8,898,373 B1 | 11/2014 | Kang et al. |
| 8,910,030 B2 | 12/2014 | Goel |
| 8,923,066 B1 | 12/2014 | Subramanian et al. |
| 9,128,690 B2 | 9/2015 | Lotzenburger et al. |
| 2001/0050824 A1 | 12/2001 | Buch |
| 2002/0024846 A1 | 2/2002 | Kawahara et al. |
| 2002/0036515 A1 | 3/2002 | Eldridge et al. |
| 2002/0083299 A1 | 6/2002 | Van Huben et al. |
| 2002/0122334 A1 | 9/2002 | Lee et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid et al. |
| 2003/0079172 A1* | 4/2003 | Yamagishi .......... H03M 13/118 714/781 |
| 2003/0088805 A1 | 5/2003 | Majni et al. |
| 2003/0093628 A1 | 5/2003 | Matter et al. |
| 2003/0163594 A1 | 8/2003 | Aasheim et al. |
| 2003/0163629 A1 | 8/2003 | Conley et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0204341 A1 | 10/2003 | Guliani et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0057575 A1 | 3/2004 | Zhang et al. |
| 2004/0062157 A1 | 4/2004 | Kawabe |
| 2004/0073829 A1 | 4/2004 | Olarig |
| 2004/0114265 A1 | 6/2004 | Talbert |
| 2004/0143710 A1 | 7/2004 | Walmsley |
| 2004/0148561 A1 | 7/2004 | Shen et al. |
| 2004/0153902 A1 | 8/2004 | Machado et al. |
| 2004/0167898 A1 | 8/2004 | Margolus et al. |
| 2004/0181734 A1 | 9/2004 | Saliba |
| 2004/0199714 A1 | 10/2004 | Estakhri et al. |
| 2004/0237018 A1 | 11/2004 | Riley |
| 2005/0060456 A1 | 3/2005 | Shrader et al. |
| 2005/0060501 A1 | 3/2005 | Shrader |
| 2005/0073884 A1 | 4/2005 | Gonzalez et al. |

(56) References Cited

U.S. PATENT DOCUMENTS

| | | |
|---|---|---|
| 2005/0108588 A1 | 5/2005 | Yuan |
| 2005/0114587 A1 | 5/2005 | Chou et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0010174 A1 | 1/2006 | Nguyen et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0085671 A1 | 4/2006 | Majni et al. |
| 2006/0087893 A1 | 4/2006 | Nishihara et al. |
| 2006/0107181 A1 | 5/2006 | Dave et al. |
| 2006/0136570 A1 | 6/2006 | Pandya |
| 2006/0136681 A1 | 6/2006 | Jain et al. |
| 2006/0156177 A1 | 7/2006 | Kottapalli et al. |
| 2006/0195650 A1 | 8/2006 | Su et al. |
| 2006/0244049 A1 | 11/2006 | Yaoi et al. |
| 2006/0259528 A1 | 11/2006 | Dussud et al. |
| 2006/0291301 A1 | 12/2006 | Ziegelmayer |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0088716 A1 | 4/2007 | Brumme et al. |
| 2007/0091677 A1 | 4/2007 | Lasser et al. |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0156842 A1 | 7/2007 | Vermeulen et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0180346 A1 | 8/2007 | Murin |
| 2007/0201274 A1 | 8/2007 | Yu et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0245099 A1 | 10/2007 | Gray et al. |
| 2007/0263442 A1 | 11/2007 | Cornwall et al. |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0013390 A1 | 1/2008 | Zipprich-Rasch |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0056005 A1 | 3/2008 | Aritome |
| 2008/0071971 A1 | 3/2008 | Kim et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147714 A1 | 6/2008 | Breternitz et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0019216 A1 | 1/2009 | Yamada et al. |
| 2009/0031083 A1 | 1/2009 | Willis et al. |
| 2009/0037652 A1 | 2/2009 | Yu et al. |
| 2009/0070608 A1 | 3/2009 | Kobayashi |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0213649 A1 | 8/2009 | Takahashi et al. |
| 2009/0222708 A1 | 9/2009 | Yamaga |
| 2009/0228761 A1 | 9/2009 | Perlmutter et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0008175 A1 | 1/2010 | Sweere et al. |
| 2010/0011261 A1 | 1/2010 | Cagno et al. |
| 2010/0020620 A1 | 1/2010 | Kim et al. |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0118608 A1 | 5/2010 | Song et al. |
| 2010/0138592 A1 | 6/2010 | Cheon |
| 2010/0153616 A1 | 6/2010 | Garratt |
| 2010/0161936 A1 | 6/2010 | Royer et al. |
| 2010/0174959 A1 | 7/2010 | No et al. |
| 2010/0199125 A1 | 8/2010 | Reche |
| 2010/0199138 A1 | 8/2010 | Rho |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0332858 A1 | 12/2010 | Trantham et al. |
| 2011/0010514 A1 | 1/2011 | Benhase et al. |
| 2011/0051513 A1 | 3/2011 | Shen et al. |
| 2011/0066597 A1 | 3/2011 | Mashtizadeh et al. |
| 2011/0078407 A1 | 3/2011 | Lewis |
| 2011/0083060 A1 | 4/2011 | Sakurada et al. |
| 2011/0099460 A1 | 4/2011 | Dusija et al. |
| 2011/0113281 A1 | 5/2011 | Zhang et al. |
| 2011/0122415 A1 | 5/2011 | Sprouse |
| 2011/0131444 A1 | 6/2011 | Buch et al. |
| 2011/0138260 A1* | 6/2011 | Savin ............ H03M 13/1182 714/795 |
| 2011/0173378 A1 | 7/2011 | Filor et al. |
| 2011/0179249 A1 | 7/2011 | Hsiao |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0222342 A1 | 9/2011 | Yoon et al. |
| 2011/0225346 A1 | 9/2011 | Goss et al. |
| 2011/0228601 A1 | 9/2011 | Olbrich et al. |
| 2011/0231600 A1 | 9/2011 | Tanaka et al. |

(56) References Cited

U.S. PATENT DOCUMENTS

| | | |
|---|---|---|
| 2011/0239077 A1* | 9/2011 | Bai ................. H03M 13/033 714/752 |
| 2011/0264843 A1 | 10/2011 | Haines et al. |
| 2011/0271040 A1 | 11/2011 | Kamizono |
| 2011/0283119 A1 | 11/2011 | Szu et al. |
| 2012/0023144 A1 | 1/2012 | Rub |
| 2012/0054414 A1 | 3/2012 | Tsai et al. |
| 2012/0063234 A1 | 3/2012 | Shiga et al. |
| 2012/0072639 A1 | 3/2012 | Goss et al. |
| 2012/0096217 A1 | 4/2012 | Son et al. |
| 2012/0110250 A1 | 5/2012 | Sabbag et al. |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0173797 A1 | 7/2012 | Shen |
| 2012/0185750 A1 | 7/2012 | Hayami |
| 2012/0195126 A1 | 8/2012 | Roohparvar |
| 2012/0203951 A1 | 8/2012 | Wood et al. |
| 2012/0216079 A1 | 8/2012 | Fai et al. |
| 2012/0233391 A1 | 9/2012 | Frost et al. |
| 2012/0236658 A1 | 9/2012 | Byom et al. |
| 2012/0239858 A1 | 9/2012 | Melik-Martirosian |
| 2012/0239976 A1 | 9/2012 | Cometti et al. |
| 2012/0259863 A1 | 10/2012 | Bodwin et al. |
| 2012/0275466 A1 | 11/2012 | Bhadra et al. |
| 2012/0278564 A1 | 11/2012 | Goss et al. |
| 2012/0284574 A1 | 11/2012 | Avila et al. |
| 2012/0284587 A1 | 11/2012 | Yu et al. |
| 2013/0007073 A1 | 1/2013 | Varma |
| 2013/0007343 A1 | 1/2013 | Rub et al. |
| 2013/0007543 A1 | 1/2013 | Goss et al. |
| 2013/0024735 A1 | 1/2013 | Chung et al. |
| 2013/0031438 A1 | 1/2013 | Hu et al. |
| 2013/0036418 A1 | 2/2013 | Yadappanavar et al. |
| 2013/0047045 A1 | 2/2013 | Hu et al. |
| 2013/0073924 A1 | 3/2013 | D'Abreu et al. |
| 2013/0079942 A1 | 3/2013 | Smola et al. |
| 2013/0086131 A1 | 4/2013 | Hunt et al. |
| 2013/0086132 A1 | 4/2013 | Hunt et al. |
| 2013/0094288 A1 | 4/2013 | Patapoutian et al. |
| 2013/0111279 A1 | 5/2013 | Jeon et al. |
| 2013/0111298 A1 | 5/2013 | Seroff et al. |
| 2013/0121084 A1 | 5/2013 | Jeon et al. |
| 2013/0124888 A1 | 5/2013 | Tanaka et al. |
| 2013/0128666 A1 | 5/2013 | Avila et al. |
| 2013/0132652 A1 | 5/2013 | Wood et al. |
| 2013/0176784 A1 | 7/2013 | Cometti et al. |
| 2013/0179646 A1 | 7/2013 | Okubo et al. |
| 2013/0191601 A1 | 7/2013 | Peterson et al. |
| 2013/0194874 A1 | 8/2013 | Mu et al. |
| 2013/0232289 A1 | 9/2013 | Zhong et al. |
| 2013/0258738 A1 | 10/2013 | Barkon et al. |
| 2013/0265838 A1 | 10/2013 | Li |
| 2013/0282955 A1 | 10/2013 | Parker et al. |
| 2013/0290611 A1 | 10/2013 | Biederman et al. |
| 2013/0301373 A1 | 11/2013 | Tam |
| 2013/0304980 A1 | 11/2013 | Nachimuthu et al. |
| 2013/0343131 A1 | 12/2013 | Wu et al. |
| 2014/0013188 A1 | 1/2014 | Wu et al. |
| 2014/0063905 A1 | 3/2014 | Ahn et al. |
| 2014/0075133 A1 | 3/2014 | Li et al. |
| 2014/0082261 A1 | 3/2014 | Cohen et al. |
| 2014/0082456 A1 | 3/2014 | Li et al. |
| 2014/0095775 A1 | 4/2014 | Talagala et al. |
| 2014/0122818 A1 | 5/2014 | Hayasaka et al. |
| 2014/0136883 A1 | 5/2014 | Cohen |
| 2014/0136927 A1 | 5/2014 | Li et al. |
| 2014/0143505 A1 | 5/2014 | Sim et al. |
| 2014/0201596 A1 | 7/2014 | Baum et al. |
| 2014/0223084 A1 | 8/2014 | Lee et al. |
| 2014/0258755 A1 | 9/2014 | Stenfort |
| 2014/0269090 A1 | 9/2014 | Flynn et al. |
| 2014/0359381 A1 | 12/2014 | Takeuchi et al. |
| 2015/0153799 A1 | 6/2015 | Lucas et al. |

FOREIGN PATENT DOCUMENTS

| | | |
|---|---|---|
| EP | 1 990 921 A2 | 11/2008 |
| EP | 2 386 958 A1 | 11/2011 |
| EP | 2 620 946 A2 | 7/2013 |
| JP | 2002-532806 S | 10/2002 |
| WO | WO 2007/036834 A2 | 4/2007 |
| WO | WO 2007/080586 A2 | 7/2007 |
| WO | WO 2008/075292 | 6/2008 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |
| WO | WO 2011/024015 | 3/2011 |

OTHER PUBLICATIONS

Canim, Buffered Bloom ilters on Solid State Storage, ADMS*10, Singapore, Sep. 13-17, 2010, 8 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology-AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
Sandisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.

(56) References Cited

OTHER PUBLICATIONS

SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
Invitation to Pay Additional Fees dates Feb. 13, 2015, received in International Patent Application No. PCT/US2014/063949, which corresponds to U.S. Appl. No. 14/135,433, 6 pages (Delpapa).
International Search Report and Written Opinion dated Jan. 21, 2015, received in International Application No. PCT/US2014/059748, which corresponds to U.S. Appl. No. 14/137,511, 13 pages (Dancho).
International Search Report and Written Opinion dated Feb. 18, 2015, received in International Application No. PCT/US2014/066921, which corresponds to U.S. Appl. No. 14/135,260, 13 pages (Fitzpatrick).
International Search Report and Written Opinion dated Jul. 25, 2014, received in International Patent Application No. PCT/US2014/029453, which corresponds to U.S. Appl. No. 13/963,444, 9 pages. (Frayer).
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
International Search Report and Written Opinion dated Sep. 14, 2015, received in International Patent Application No. PCT/US2015/036807, which corresponds to U.S. Appl. No. 14/311,152, 9 pages (Higgins).
Ashkenazi et al., "Platform independent overall security architecture in multi-processor system-on-chip integrated circuits for use in mobile phones and handheld devices." ScienceDireet, Computers and Electrical Engineering 33 (2007), 18 pages.

Lee et al., "A Semi-Preemptive Garbage Collector for Sold State Drives," Apr. 2011, IEEE, pp. 12-21.
Office Action dated Feb. 17, 2015, received in Chinese Patent Application No. 201210334987.1, which corresponds to U.S. Appl. No. 12/082,207, 9 pages (Prins).
International Search Report and Written Opinion dated May 4, 2015, received in International Patent Application No. PCT/US2014/065987, which corresponds to U.S. Appl. No. 14/135,400, 12 pages (George).
International Search Report and Written Opinion dated Mar. 17, 2015, received in International Patent Application No. PCT/US2014/067467, which corresponds to U.S. Appl. No. 14/135,420, 13 pages (Lucas).
International Search Report and Written Opinion dated Apr. 20, 2015, received in International Patent Application No. PCT/US2014/063949, which corresponds to U.S. Appl. No. 14/135,433, 21 pages (Delpapa).
International Search Report and Written Opinion dated Mar. 9, 2015, received in International Patent Application No. PCT/US2014/059747, which corresponds to U.S. Appl. No. 14/137,440, 9 pages (Fitzpatrick).
Bayer, "Prefix B-Trees", IP.COM Journal, IP.COM Inc., West Henrietta, NY, Mar. 30, 2007, 29 pages.
Bhattacharjee et al., "Efficient Index Compression in DB2 LUW", IBM Research Report, Jun. 23, 2009, http://domino.research.ibm.com/library/cyberdig.nsf/papers/40B2C45876DOD747852575E10062OCE7/$File/rc24815.pdf, 13 pages.
Oracle, "Oracle9i: Database Concepts", Jul. 2001, http://docs.oracle.com/cd/A91202_01/901_doc/server.901/a88856.pdf, 49 pages.
International Search Report and Written Opinion dated Jun. 8, 2015, received in International Patent Application No. PCT/US2015/018252, which corresponds to U.S. Appl. No. 14/339,072, 9 pages (Busch).
International Search Report and Written Opinion dated Jun. 2, 2015, received in International Patent Application No. PCT/US2015/018255, which corresponds to U.S. Appl. No. 14/336,967, 14 pages (Chander).
International Search Report and Written Opinion dated Jun. 30, 2015, received in International Patent Application No. PCT/US2015/023927, which corresponds to U.S. Appl. No. 14/454,687, 11 pages (Kadayam).
Office Action dated Dec. 8, 2014, received in Chinese Patent Application No. 201180021660.2, which corresponds to U.S. Appl. No. 12/726,200, 7 pages (Olbrich).
Office Action dated Jul. 31, 2015, received in Chinese Patent Application No. 201180021660.2, which corresponds to U.S. Appl. No. 12/726,200, 9 pages (Olbrich).
International Search Report and Written Opinion dated Jul. 23, 2015, received in International Patent Application No. PCT/US2015/030850, which corresponds to U.S. Appl. No. 14/298,843, 12 pages (Ellis).

* cited by examiner

Figure 4A

6x6 Circulant
Sub-Matrix $\begin{matrix} 1 & 1 & 0 & 0 & 0 & 0 \\ 0 & 1 & 1 & 0 & 0 & 0 \\ 0 & 0 & 1 & 1 & 0 & 0 \\ 0 & 0 & 0 & 1 & 1 & 0 \\ 0 & 0 & 0 & 0 & 1 & 1 \\ 1 & 0 & 0 & 0 & 0 & 1 \end{matrix}$ ⇒ $P_{i,j}$ 400-a        400-b

Figure 4B

| $P_{1,1}$ | $P_{2,1}$ | $P_{3,1}$ | ... | $P_{k,1}$ |
|---|---|---|---|---|
| $P_{1,2}$ | $P_{2,2}$ | $P_{3,2}$ | ... | $P_{k,2}$ |
| ... | ... | ... | ... | ... |
| $P_{1,m}$ | $P_{2,m}$ | $P_{3,m}$ | ... | $P_{k,m}$ |

| $P_{1,1}$ | $P_{2,1}$ | $P_{3,1}$ | ... | $P_{k,1}$ |
|---|---|---|---|---|
| $P_{1,2}$ | $P_{2,2}$ | $P_{3,2}$ | ... | $P_{k,2}$ |
| ... | ... | ... | ... | ... |
| $P_{1,m}$ | $P_{2,m}$ | $P_{3,m}$ | ... | $P_{k,m}$ |

| $P_{1,1}$ | $P_{2,1}$ | $P_{3,1}$ | ... | $P_{k,1}$ |
|---|---|---|---|---|
| $P_{1,2}$ | $P_{2,2}$ | $P_{3,2}$ | ... | $P_{k,2}$ |
| ... | ... | ... | ... | ... |
| $P_{1,m}$ | $P_{2,m}$ | $P_{3,m}$ | ... | $P_{k,m}$ |

410-c                                                410

US 9,236,886 B1

UNIVERSAL AND RECONFIGURABLE QC-LDPC ENCODER

RELATED APPLICATIONS

This application claims priority to U.S. Provisional Patent Application No. 61/801,394, filed Mar. 15, 2013, which is hereby incorporated by reference in its entirety.

TECHNICAL FIELD

The present disclosure relates to using error control codes in memory systems, and in particular, to LDPC encoding.

BACKGROUND

Error control coding (ECC) is used to limit the likelihood of uncorrectable errors in memory systems (e.g., non-volatile memories, such as flash memory devices). One ECC option is known as low-density parity check (LDPC) coding. LDPC coding is particularly useful because the generated codewords may be iteratively decoded, which in turn, provides strong error correction capability.

Generating the parity information to be included in a codeword when using LDPC coding with large codewords (e.g., codewords of 0.5 kilobytes or larger) requires a substantial number of computations, which can be reflected in system implementation cost and/or encoding latency.

SUMMARY

Some implementations include systems, methods and/or devices enabled to generate a quasi-cyclic low-density parity check (QC-LDPC) codeword based on information data (e.g., received from a host). Each of a plurality of parity segments (e.g., m parity segments) is generated by multiplying each of k b×b circulant sub-matrices comprising a respective column of a parity matrix (e.g., an m×k array of b×b circulant sub-matrices) by a corresponding b-sized trunk of the information data. Each multiplication of a b×b circulant sub-matrix by a corresponding trunk comprises $b^2$ concurrent computations (e.g., via $b^2$ AND gates), each of which mathematically combines a respective element of the b×b circulant sub-matrix with a respective element of the corresponding trunk.

Some implementations include systems, methods and/or devices enabled to support the generation of a codeword in accordance with a QC-LDPC code selected from two or more QC-LDPC codes. A P-matrix memory (e.g., a component of an encoder) stores two or more distinct parity matrices corresponding to the two or more QC-LDPC codes. In some embodiments, the two or more QC-LDPC codes comprise different values for at least one of the set comprising: b, m and k.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 4A is prophetic circulant sub-matrix, in accordance with some embodiments.

FIG. 4B-4D are representations of a parity matrix corresponding to an encoding schedule, in accordance with some embodiments.

Figure 1:
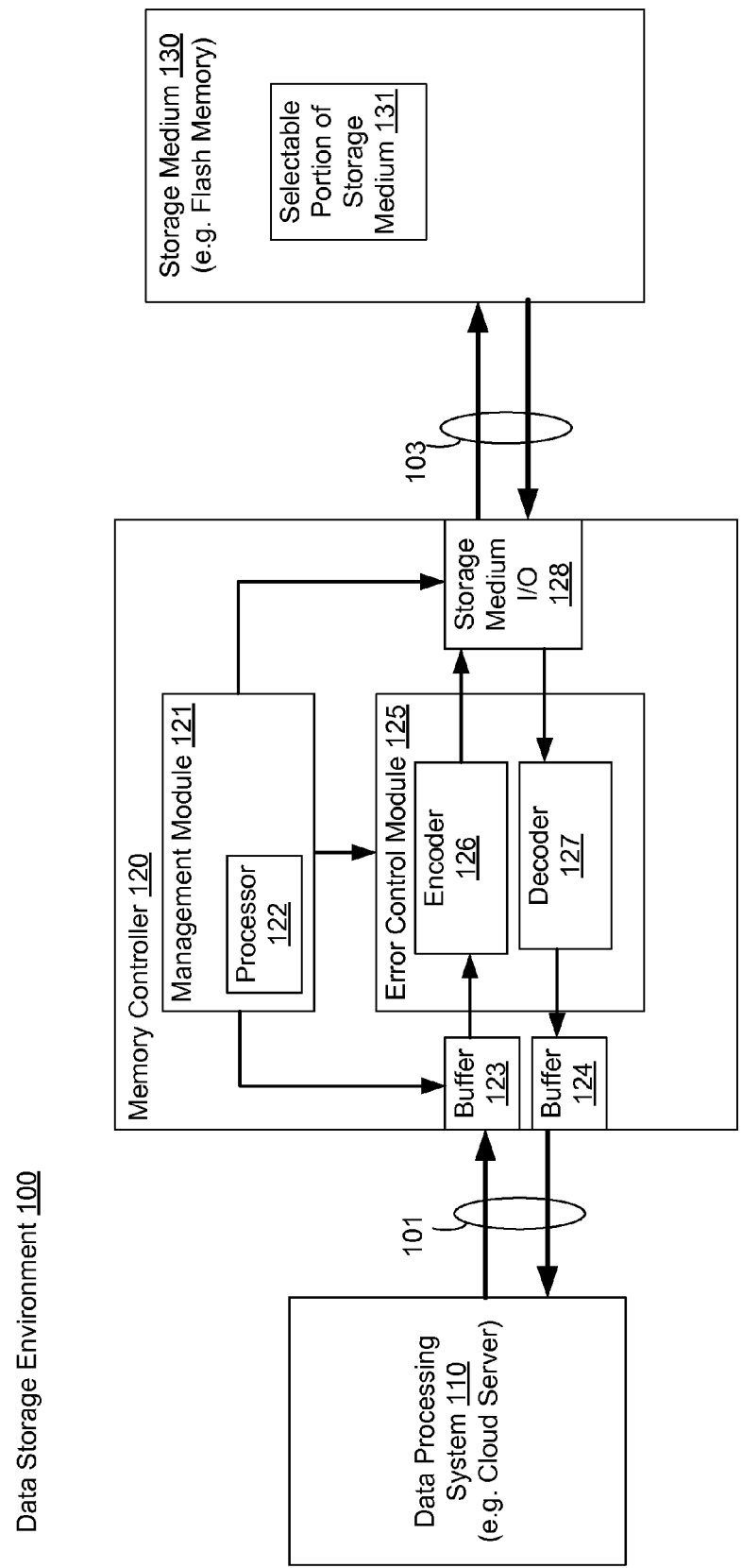
FIG. 1 is a schematic diagram of a data storage environment, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

The various implementations described herein include systems, methods and/or devices that may enhance the performance of error control codes used to improve the reliability with which data can be stored in and read from a storage medium, such as a flash memory. Some implementations include systems, methods and/or devices to generate a QC-LDPC codeword based on information data obtained from a host, where the codeword includes parity information generated based on a respective parity matrix comprising an array of circulant sub-matrices.

More specifically, some implementations include a method for generating a QC-LDPC codeword at an LDPC encoder. The method includes receiving information data (e.g., data specified by a host to be written to a memory device). The method further includes generating parity information, based on a parity matrix P comprising an m×k array of b×b circulant sub-matrices, including m columns of said sub-matrices, where m, k and b are integers greater than 1, each column comprising k of the sub-matrices. Alternatively, b is an integer greater than one, either m or k is an integer greater than one, and the other one of m and k is an integer greater than zero. Generating the parity information includes: dividing the information data into a plurality of b sized trunks; and generating m parity segments. Each of the m parity segments consists of b bits, and each of the m parity segments is generated by multiplying each of the k b×b circulant sub-matrices in a respective column of the parity matrix P by a corresponding trunk of the information data. Each multiplication of a b×b circulant sub-matrix by a corresponding trunk comprises $b^2$ concurrent computations and each multiplication mathematically combines a respective element of the b×b circulant sub-matrix with a respective element of the corresponding trunk. Finally, the method includes generating a codeword based on the information data and the m parity segments.

In some embodiments, each b×b circulant sub-matrix comprises elements q(r,s) each having a value in accordance with $q(r,s)=q(r+t \bmod (b), s+t \bmod (b))$, where t is any value between 1 and b−1, and all elements of the b×b circulant sub-matrix correspond to the elements q(0,s), for s=0 to b−1, in a first row of the b×b circulant sub-matrix.

In some embodiments, each multiplication of the b×b circulant sub-matrix by the corresponding trunk comprising $b^2$ concurrent computations occurs in a single clock cycle, each parity segment is generated in k clock cycles and all m parity segments are generated in k–m clock cycles.

In some embodiments, each parity segment is generated via k sub-operations, and in k−1 of the sub-operations, an intermediate result from a prior sub-operation is mathematically combined with the results from the $b^2$ concurrent computations.

In some embodiments, the last one of the k sub-operations generates a final result of b parity bits.

In some embodiments, a different trunk of the information data is used to perform each of the k sub-operations.

In some embodiments, the same trunk of the information data is used to perform the respective j-th sub-operation of the k sub-operations in each of the m columns of the P matrix.

In some embodiments, each multiplication of the b×b circulant sub-matrix by the corresponding trunk is performed by a set of $b^2$ logic gates, the set of $b^2$ logic gates are coupled to receive b generator elements q(r,s), where for each generator element q(r,s), b of the logic gates receive the same generator element q(r,s). In some embodiments, each of the b generator elements q(r,s) has a value in accordance with q(r,s)=q(r+t mod (b), s+t mod (b)), where t is any value between 1 and b−1.

In some embodiments, the method further includes: storing two or more distinct parity matrices; selecting one of the two or more distinct parity matrices; and generating parity information, based on the selected one of the two or more distinct parity matrices.

In some embodiments, a first parity matrix P1 of the two or more distinct parity matrices comprises an m1×k1 array of b1×b1 circulant sub-matrices, and a second parity matrix P2 of the two or more distinct parity matrices comprises an m2×k2 array of b2×b2 circulant sub-matrices, where one or more of m1, k1 and b1 is unequal to m2, k2 or b2, respectively.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a diagram of an implementation of a data storage system 100. While some example features are illustrated, those skilled in the art will appreciate from the present disclosure that various other features have not been illustrated for the sake of brevity and so as not to obscure more pertinent aspects of the example implementations disclosed herein. To that end, as a non-limiting example, the data storage system 100 includes a memory controller 120, and a storage medium 130, and is used in conjunction with a computer system 110. In some implementations, storage medium 130 is a single flash memory device while in other implementations storage medium 130 includes a plurality of flash memory devices. In some implementations, storage medium 130 comprises at least one of NAND-type flash memory and NOR-type flash memory. Further, in some implementations memory controller 120 is a solid-state drive (SSD) controller. However, those skilled in the art will appreciate that various other types of storage media may be included in accordance with aspects of a wide variety of implementations.

Computer system 110 is coupled to memory controller 120 through data connections 101. However, in some implementations computer system 110 includes memory controller 120 as a component and/or a sub-system. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some implementations, computer system 110 includes one or more processors, one or more types of memory, a display and/or other user interface components such as a keyboard, a touch screen display, a mouse, a track-pad, a digital camera and/or any number of supplemental devices to add functionality.

Storage medium 130 is coupled to memory controller 120 through connections 103. Connections 103 are sometimes called data connections, but typically convey commands in addition to data, and optionally convey metadata, error correction information and/or other information in addition to data values to be stored in storage medium 130 and data values read from storage medium 130. In some implementations memory controller 120 and storage medium 130 are included in the same device as components thereof. Furthermore, in some implementations memory controller 120 and storage medium 130 are embedded in a host device, such as a mobile device, tablet, other computer or computer controlled device, and the methods described herein are performed by the embedded memory controller. Storage medium 130 may include any number (i.e., one or more) of memory devices including, without limitation, non-volatile semiconductor memory devices, such as flash memory. For example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

Storage medium 130 is divided into a number of addressable and individually selectable blocks, such as selectable portion 131. In some implementations, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some implementations (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

For example, one block comprises any number of pages, for example, 64 pages, 128 pages, 256 pages, or another suitable number of pages. Blocks are typically grouped into a plurality of zones. Each block zone can be independently managed to some extent, which increases the degree of parallelism for parallel operations and simplifies management of storage medium 130.

As noted above, while data storage densities of non-volatile semiconductor memory devices are generally increasing, a drawback of increasing storage density is that the stored data is more prone to being stored and/or read erroneously. As described in greater detail below, error control coding can be utilized to limit the number of uncorrectable errors that are introduced by electrical fluctuations, defects in the storage medium, operating conditions, device history, write-read circuitry, etc., or a combination of these and various other factors.

In some implementations, memory controller 120 includes a management module 121, an input buffer 123, an output buffer 124, an error control module 125 and a storage medium interface (I/O) 128. Memory controller 120 may include various additional features that have not been illustrated for the sake of brevity and so as not to obscure more pertinent features of the example implementations disclosed herein, and that a different arrangement of features may be possible. Input and output buffers 123,124 provide an interface to computer system 110 through data connections 101. Similarly, storage medium I/O 128 provides an interface to storage medium 130 though connections 103. In some implementations, storage medium I/O 128 includes read and write circuitry, including circuitry capable of providing reading signals to storage medium 130 (e.g., reading threshold voltages for NAND-type flash memory).

In some implementations, management module 121 includes one or more processing units (CPUs, also sometimes called processors) 122 configured to execute instructions in one or more programs (e.g., in management module 121). In some implementations, the one or more processors 122 are shared by one or more components within, and in some cases, beyond the function of memory controller 120. Management module 121 is coupled to input buffer 123, output buffer 124 (connection not shown), error control module 125 and storage medium I/O 128 in order to coordinate the operation of these components.

Error control module 125 is coupled to storage medium I/O 128, input buffer 123 and output buffer 124. Error control module 125 is provided to limit the number of uncorrectable errors inadvertently introduced into data. In some embodiments, error control module 125 is executed in software by the one or more processors 122 of management module 121, and, in other embodiments, error control module 125 is implemented in whole or in part using special purpose circuitry to perform encoding and decoding functions. To that end, error control module 125 includes an encoder 126 and a decoder 127. Encoder 126 encodes data by applying an error control code (e.g., a respective QC-LDPC code selected from two or more QC-LDPC codes) to produce a codeword, which is subsequently stored in storage medium 130.

When the encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand some algorithms, such as the Viterbi algorithm, may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 130 from computer system 110. The data held in input buffer 123 is made available to encoder 126, which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands on control line 111 to memory controller 120 requesting data from storage medium 130. Memory controller 120 sends one or more read access commands to storage medium 130, via storage medium I/O 128, to obtain raw read data in accordance with memory locations (e.g., addresses) specified by the one or more host read commands. Storage medium I/O 128 provides the raw read data (e.g., comprising one or more codewords) to decoder 127. If the decoding is successful, the decoded data is provided to output buffer 124, where the decoded data is made available to computer system 110. In some implementations, if the decoding is not successful, memory controller 120 may resort to a number of remedial actions or provide an indication of an irresolvable error condition.

Figure 2:
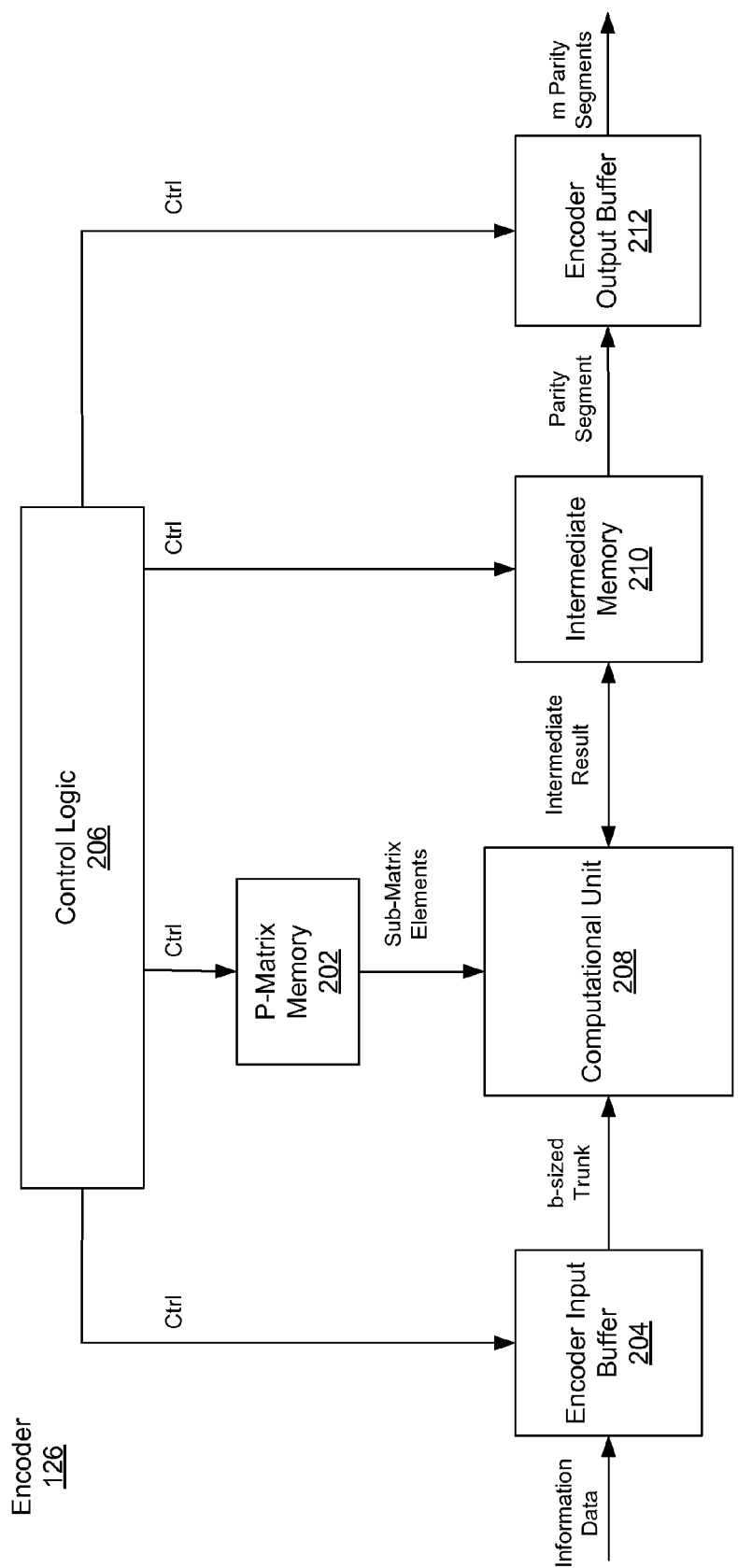
FIG. 2 is a schematic diagram of an implementation of the encoder in FIG. 1, in accordance with some embodiments.

FIG. 2 is a schematic diagram of an implementation of encoder 126 included in FIG. 1. Encoder 126 is configured to generate m parity segments, to be included in a QC-LDPC codeword, based on information data u. In some embodiments, encoder 126 includes a P-matrix memory 202, an encoder input buffer 204, control logic 206, a computational unit 208, an intermediate memory 210 and an encoder output buffer 212.

P-matrix memory 202 is configured to store one or more quasi-cyclic low density parity check (QC-LDPC) codes. An LDPC code is defined by its parity-check matrix H. The parity check matrix of a QC-LDPC code is an array of circulants of the same size (e.g., b×b).

A circulant is a square matrix in which each row is a cyclic shift (e.g., one place to the right) of the row above it, and the first row is the cyclic shift of the last row. For such a circulant, each column is a downward cyclic shift of the column to its left and the first column is the cyclic shift of the last column. The row and column weights of a circulant are the same; thus, a circulant has a weight w. A circulant is completely characterized by its first column or first row, which is called the generator (or sometimes called generator elements $q(r,s)$) of the circulant. In some implementations, the circulants are sparse circulants having fewer than 20% nonzero elements or w≤20% "1s."

In order to perform encoding, a generator matrix G is derived by the equation $H \cdot G^T = 0$. A systematic G matrix is defined to be a matrix that can be decomposed into two parts G=[I P], where I is an identity matrix and P is called a parity matrix. Thus, a codeword, c, generated via a systematic G matrix will have the form c=[u, p], where u is information data and p is parity information. Furthermore, the parity information, p, is generated in accordance with the equation p=u×P.

For each of the one or more QC-LDPC codes stored in P-matrix memory 202, the G matrix is formulated such that its P matrix consists of an m×k array of circulant sub-matrices. Each sub-matrix $P_{i,j}$ is a b×b circulant sub-matrix, where i corresponds to a respective row of the array and j corresponds to a respective column of the array. Accordingly, parity matrix P has the following format:

$$P = \begin{bmatrix} P_{1,1} & \cdots & P_{1,m} \\ \vdots & \ddots & \vdots \\ P_{k,1} & \cdots & P_{k,m} \end{bmatrix}. \quad (1)$$

In some embodiments, P-matrix memory 202 is configured to store generator elements q(r,s) consisting only of a first row or column of each circulant sub-matrix $P_{i,j}$ for a respective parity matrix. In some embodiments, P-matrix memory 202 comprises RAM, SRAM, DRAM, flash memory, etc. local to the memory controller, or remote from the memory controller, or both.

Encoder input buffer 204 is coupled to obtain information data u from input buffer 123. For example, information data u is data specified by a host to be written to a memory device (e.g., storage medium 130). In some embodiments, encoder input buffer 204 is configured to store information data u until all m parity segments for a respective codeword are generated by encoder 126. In some embodiments, encoder input buffer 204 is configured to store information data u for k·m clock cycles.

Control logic 206 is coupled to P-matrix memory 202, encoder input buffer 204, intermediate memory 210 and encoder output buffer 212. Control logic 206 is configured to coordinate the operations of encoder 126 by providing a respective control signal to each of P-matrix memory 202, encoder input buffer 204, intermediate memory 210 and encoder output buffer 212. Control logic 206 is configured to divide the information data u stored in encoder input buffer 204 into a plurality of b-sized trunks for use by computational unit 208, where u=[$u_1, u_2, \ldots, u_k$]. In some embodiments, control logic 206 is configured to send a control signal to P-matrix memory 202 in order to select generator elements q(r,s) corresponding to a single row or column of a respective circulant $P_{i,j}$ to provide to computational unit 208. In some embodiments, control logic 206 is configured to select a respective parity matrix of two or more distinct parity matrices stored in P-matrix memory 202.

Computational unit 208 is coupled to P-matrix memory 202, encoder input buffer 204 and intermediate memory 210. Computational unit 208 is coupled to obtain a respective b-sized trunk of information data from encoder input buffer 204 every clock cycle. Computational unit 208 is coupled to obtain generator elements q(r,s) (e.g., a first column or row) corresponding to a respective b×b circulant sub-matrix $P_{i,j}$ from P-matrix memory 202 every clock cycle. Computational unit 208 is configured to generate a respective parity segment via k sub-operations, where each sub-operation includes $b^2+b$ computations, as explained in more detail below. Computational unit 208 is coupled to obtain an intermediate result corresponding to a previous clock cycle from intermediate memory 210 while performing k−1 of the sub-operations.

Computational unit 208 is configured to multiply a respective b-sized trunk of information data by a respective b×b circulant $P_{i,j}$ in a respective j-th column of a parity matrix each clock cycle via $b^2$ concurrent computations. In some implementations, the $b^2$ concurrent computations are performed by $b^2$ AND gates. In k−1 of the sub-operations, computational unit 208 is further configured to mathematically combine the results from the $b^2$ concurrent computations for the current sub-operation with the intermediate results from a previous sub-operation. In some implementations, the mathematical combination comprises b XOR operations.

Computational unit 208 is configured to generate a respective parity segment every k clock cycles, where after k clock cycles each of the k b×b circulant sub-matrices in a respective j-th column of the parity matrix has been multiplied by a corresponding trunk of the plurality of b-sized trunks. For example, a parity segment p generated for a respective j-th column of the parity matrix is represented by the equation:

$$p_j = \sum_{i=1}^{k} u_i \times P_{i,j}. \quad (2)$$

$p_j$ is the result of modulo 2 addition. In other words, $p_j$=($u_1 \times P_{1,j}$)⊕($u_2 \times p_{2,j}$)⊕...⊕($u_k \times P_{k,j}$), where ⊕ is an XOR operator.

Intermediate memory 210 is coupled to obtain intermediate results for each of the k sub-operations performed by computational unit 208. In some embodiments, the intermediate result obtained from computational unit 208 for the k-th sub-operation of a respective j-th column of a parity matrix is a final result of b parity bits. In other words, the result of the k-th sub-operation is a respective parity segment $P_j$ for the respective j-th column of the parity matrix, where $P_j$ consists of b bits.

Encoder output buffer 212 is coupled to obtain a final result of b parity bits from intermediate memory 210 every k clock cycles, where the final result of b parity bits is a parity segment $p_j$ for a respective j-th column of a parity matrix. In some embodiments, encoder output buffer 212 is configured to store parity segments until all m parity segments have been generated by encoder 126, where all m parity segments are generated after k·m clock cycles.

Figure 3A:
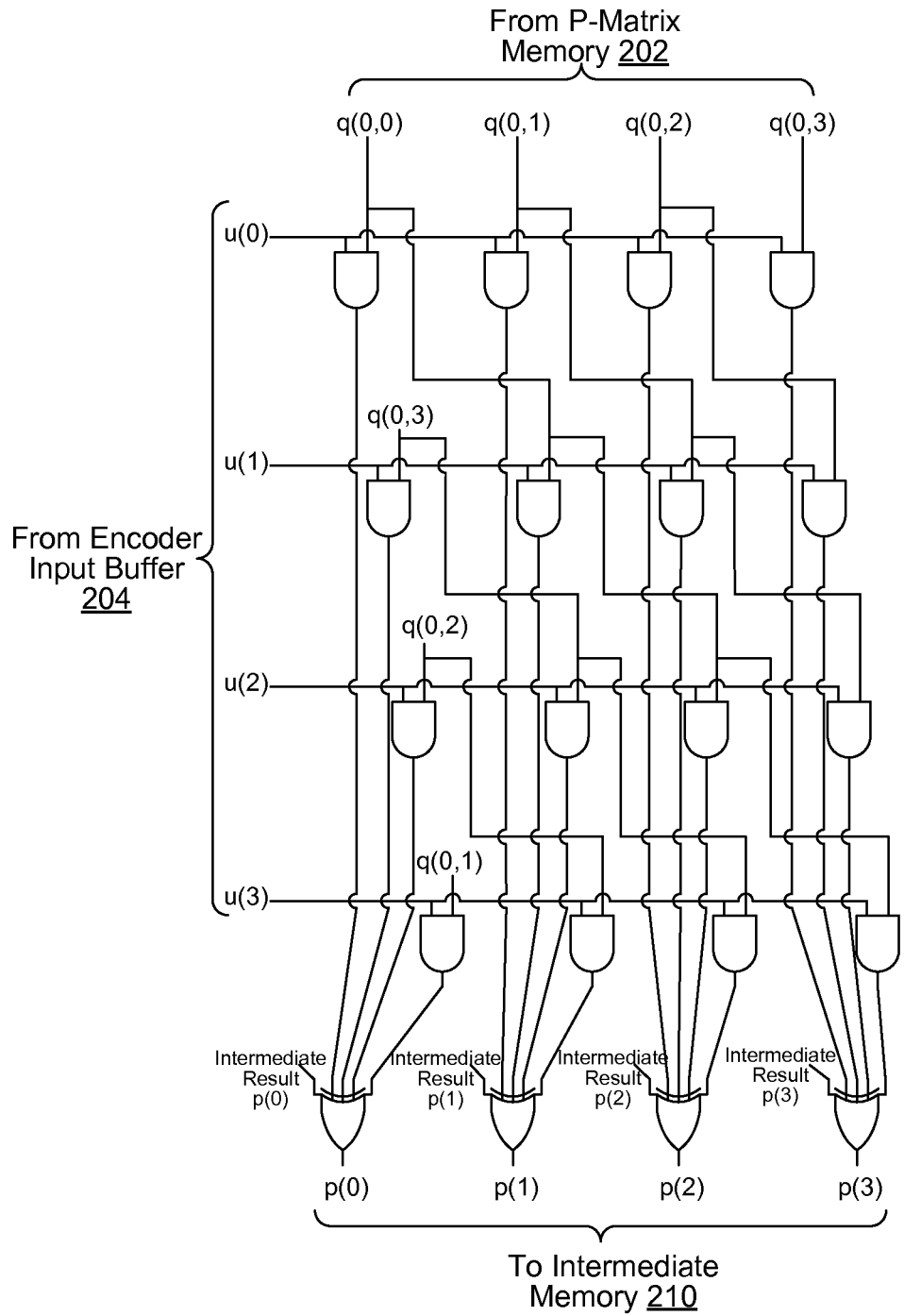
FIG. 3A is a schematic diagram of an implementation of the computational unit in FIG. 2, in accordance with some embodiments.

FIG. 3A illustrates an implementation of computational unit 208 included in FIG. 2. Computational unit 208 obtains a b-sized trunk of information data from encoder input buffer 204 every clock cycle. Furthermore, computational unit 208 obtains generator elements q(r,s) corresponding to a first row or column of a respective b×b circulant sub-matrix $P_{i,j}$ every clock cycle. $P_{i,j}$ comprises elements q(r,s) each having a value in accordance with q(r,s)=q((r+t) mod (b), (s+t) mod (b)), where 0≤t≤b−1, and mod( ) is the modulo function. All elements of $P_{i,j}$, for example, correspond to the elements q(0,s), for 0≤s≤b−1, in a first row of the respective b×b circulant sub-matrix.

FIG. 3A, for example, shows computational unit 208 comprising $b^2$ AND gates and b XOR gates each with b+1 inputs, where b=4. FIG. 3A, for example, further shows computational unit 208 obtaining a 4-bit trunk of information data comprising bits u(0), u(1), u(2), u(3) from encoder input buffer 204 and generator elements q(0,0), q(0,1), q(0,2), q(0,3) corresponding to a first row of a 4×4 circulant sub-matrix $P_{i,j}$ obtained from P-matrix memory 202. The circulant sub-matrix $P_{i,j}$ is characterized by its first row (or alternatively by its first column). In this example, the first row {q(0,0), q(0,1), q(0,2), q(0,3)} of the respective 4×4 circulant sub-matrix $P_{i,j}$ is multiplied by the first bit u(0) of the 4-bit trunk of information data via a first row of 4 AND gates. In this example, the second row {q(0,3), q(0,0), q(0,1), q(0,2)} (e.g., the second row is the first row with each element shifted to the right by one) of the respective 4×4 circulant sub-matrix $P_{i,j}$ is multiplied by the second bit u(1) of the 4-bit trunk of information data via a second row of 4 AND gates. In this example, the next two rows of the respective 4×4 circulant sub-matrix $P_{i,j}$ are multiplied by the third and fourth bits of the 4-bit trunk of information data. Lastly in this example, the outputs of each column of AND gates are mathematically combined with a corresponding intermediate result {p(0), p(1), p(2), p(3)} for the last clock cycle obtained from intermediate memory 210, where the mathematic combination is generated by a set of 4 XOR gates each with 5 inputs. The result, in this example, produced by the set of 4 XOR gates is an intermediate result of 4 bits for the current clock cycle.

FIG. 3A, for example, illustrates an example embodiment, where b=4; however, a more typical b value is 64, 96, 128, etc. A higher b value enables the k and m values to remain low so as to limit the number of clock cycles necessary to generate the parity information for a codeword. In some embodiments, control logic 206 is enabled to select a respective QC-LDPC code of two or more QC-LDPC codes stored in P-matrix memory 202. A respective QC-LDPC code of the two or more QC-LDPC codes comprises a parity matrix with an array of b'×b' circulant sub-matrices. Encoder 126 is capable of generating parity information based on the respective QC-LDPC code so long as b'≤b, where b is, for example, the square root of the number of AND gates in computational unit 208.

Figure 3B:
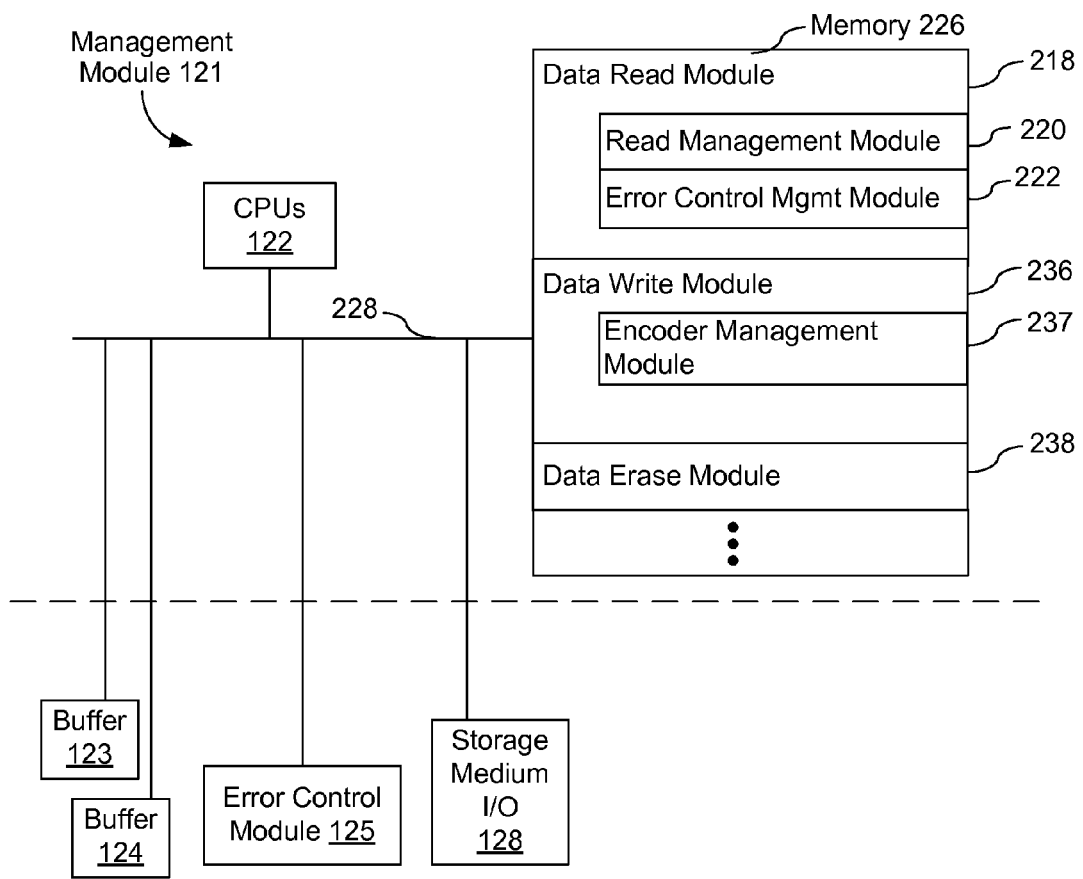
FIG. 3B is a block diagram illustrating an exemplary management module, in accordance with some embodiments.

FIG. 3B is a block diagram illustrating an exemplary management module 121, in accordance with some embodiments. Management module 121 typically includes one or more processing units (CPUs) 122 for executing modules, programs and/or instructions stored in memory 226 and thereby performing processing operations, memory 226, and one or more communication buses 228 for interconnecting these components. Communication buses 228 optionally include circuitry (sometimes called a chipset) that interconnects and controls communications between system components. Management module 121 is coupled to buffer 123, buffer 124, error control module 125, and storage medium I/O 128 by communication buses 228. Memory 226 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 226 optionally includes one or more storage devices remotely located from the CPU(s) 122. Memory 226, or alternately the non-volatile memory device(s) within memory 226, comprises a non-transitory computer readable storage medium. In some embodiments, memory 226, or the computer readable storage medium of memory 226 stores the following programs, modules, and data structures, or a subset or superset thereof:

- a data read module 218 that is used for reading data from a storage medium;
- a data write module 236 that is used for writing data to a storage medium; and
- a data erase module 238 that is used for erasing data from a storage medium.

In some embodiments, the data read module 218, optionally, includes the following modules or sub-modules, or a subset or superset thereof:

- a read management module 220 that is used for controlling or managing execution of read commands received from a host device such as computer system 110 (as in FIG. 1); and
- an error control management module 222 that is used to receive error indicators from error control module 125 and, optionally, to control operation of error control module 125.

In some embodiments, data write module 236 optionally includes an encoder management module 237 for controlling operation of encoder 126, and optionally input buffer 123, so as to implement any of the methods of generating a QC-LDPC codeword described herein.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 226 may store a subset of the modules and data structures identified above. Furthermore, memory 226 may store additional modules and data structures not described above. In some embodiments, the programs, modules, and data structures stored in memory 226, or the computer readable storage medium of memory 226, provide instructions for implementing any of the methods described below with reference to FIG. 6A-6C.

Although FIG. 3B shows a management module 121, FIG. 3B is intended more as functional description of the various features which may be present in a management module than as a structural schematic of the embodiments described herein. In practice, and as recognized by those of ordinary skill in the art, items shown separately could be combined and some items could be separated.

FIG. 4A illustrates a prophetic circulant sub-matrix of a parity matrix comprising an array of circulant sub-matrices. Circulant sub-matrix 400-a is a 6×6 circulant sub-matrix with weight, w=2. Circulant sub-matrix 400-a as illustrated in FIG. 4A is representative of a respective circulant sub-matrix $P_{i,j}$ 400-b for the parity matrix.

FIGS. 4B-4D illustrate representations of a parity matrix according to a partial-parallel encoding schedule. FIGS. 4B-4D illustrate parity matrix 410, a k×m array of b×b circulant sub-matrices. Circulant sub-matrix 400-b in FIG. 4A, for example, is representative of one of the array of circulant sub-matrices that comprises parity matrix 410. FIGS. 4B-4D illustrate parity matrix 410 in three distinct states (410-a, 410-b and 410-c) according to the encoding schedule.

FIG. 4B illustrates parity matrix 410 in state 410-a corresponding to the state of encoding after a first clock cycle. During the first clock cycle, encoder 126, for example, multiplies a first circulant sub-matrix $P_{1,1}$ of parity check matrix 410 with a corresponding first b-sized trunk of information data so as to generate an intermediate result of b bits.

FIG. 4C illustrates parity matrix 410 in state 410-b corresponding to the state of encoding after k clock cycles. During the k-th clock cycle, encoder 126, for example, multiplies a final circulant sub-matrix $P_{k,1}$ in the first column of parity check matrix 410 with a corresponding final b-sized trunk of information data so as to generate a final result of b parity bits for the first column of parity check matrix 410. In other words, encoder completes generation of a first parity segment $p_1$ of the m parity segments corresponding to the first column of parity check matrix 410.

FIG. 4D illustrates parity matrix 410 in state 410-c corresponding to the state of encoding after k·m clock cycles. During clock cycle k·m, encoder 126, for example, multiplies a final circulant sub-matrix $P_{k,1}$ in the final (m-th) column of parity check matrix 410 with a corresponding final b-sized trunk of information data so as to generate a final result of b parity bits for the m-th column of parity check matrix 410. In other words, encoder completes generation of the m parity segments comprising parity information $p=[p_1, p_2, \ldots, p_m]$.

A typical k value is, for example, between 40 and 80, and a typical m value is, for example, between 4 and 20. In some embodiments, P-matrix memory 202 stores two or more distinct parity matrices corresponding to two or more distinct QC-LDPC codes each with different m values. In some embodiments, memory controller 120 selects a respective QC-LDPC code of the two or more QC-LDPC codes, for example, based on a current program-erase (PE) count for a respective portion of a storage medium. In some embodiments, the PE count is one of a plurality of characterization parameter values associated with a characterization vector corresponding to the respective portion of the storage medium. In some implementations, the plurality of characterization parameter values provide an indication of at least one of: a physical characteristic associated with the respective portion the storage medium (e.g., a distinct die, block zone, block, word line, word line zone or page portion of storage medium 130), a mode of operation associated with the respective portion of the storage medium, a history of use associated with the respective portion of the storage medium, a condition characteristic associated with the respective portion of the storage medium, a read type associated with the respective portion of the storage medium, and location(s) associated with the respective portion of the storage medium. In some embodiments, characterization vectors are stored in a memory local to management module 121, a memory local to memory controller 120 but not external to management module 121, a memory external to memory controller 120, or a subset or superset thereof.

P-matrix memory 202, for example, stores three QC-LDPC codes with respective m-values 4, 8, and 16. A QC-LDPC with a higher m-value, for example, corresponds to a codeword with a higher number of parity segments (e.g., a codeword with a higher number of parity segments is stronger and more complex). In this example, the first QC-LDPC code with m=4 is utilized when the current PE count for the respective portion of the storage medium is low (e.g., $10^3$ PE cycles), and the third QC-LDPC code with m=16 is utilized when the current PE count for the respective portion of the storage medium is high (e.g., $10^6$ PE cycles).

Figure 5:
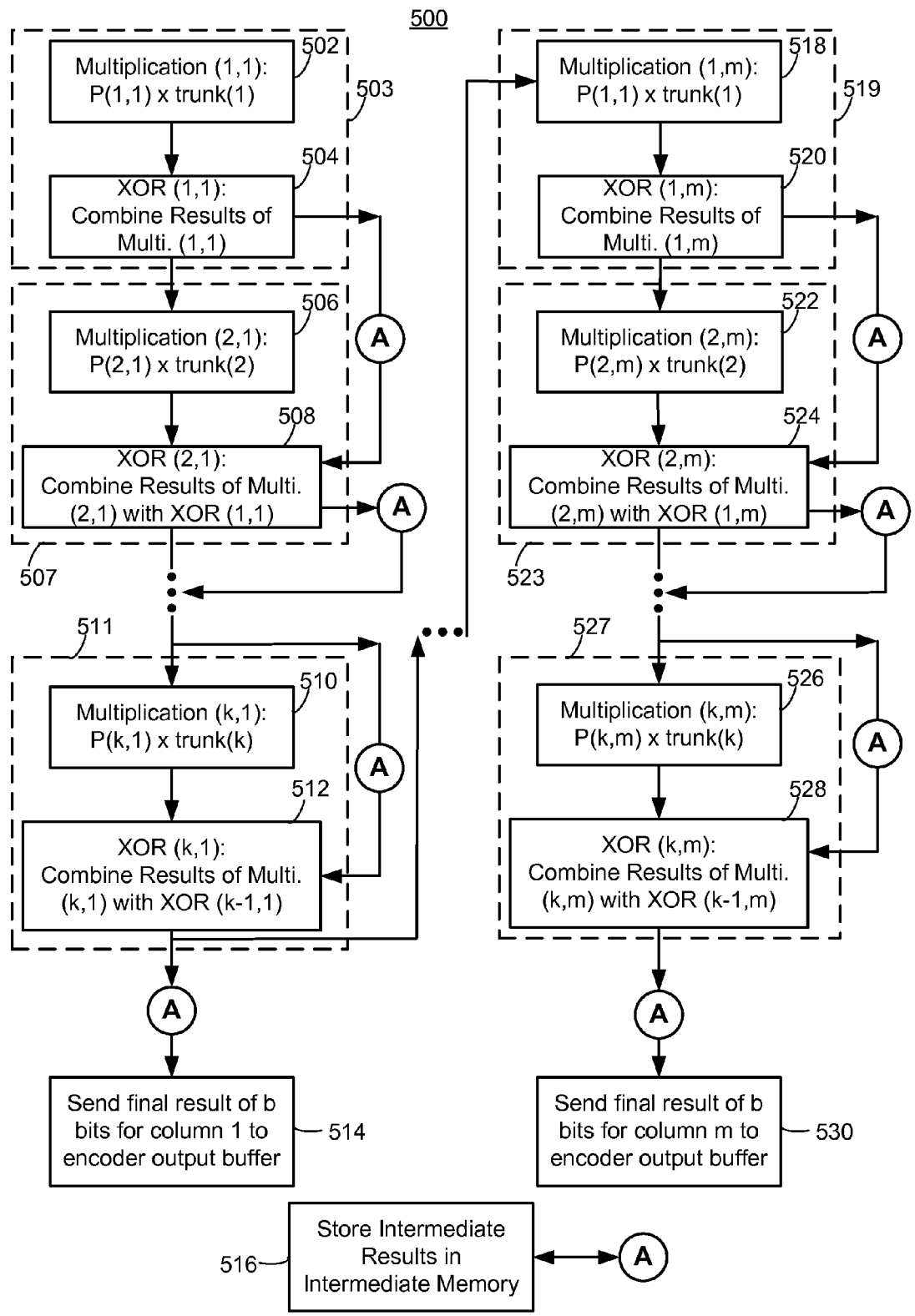
FIG. 5 is a flow diagram of an encoding schedule, in accordance with some embodiments.

FIG. 5 is a flowchart representation of a method 500, herein called an encoding schedule, for generating a QC-LDPC codeword with m parity segments. In some embodiments, encoding schedule 500 is performed by memory controller 120 or a component of memory controller 120 (e.g., encoder 126 included in FIG. 2). Encoding schedule 500 operates using a parity matrix comprising an m×k array of b×b circulant sub-matrices. For example, a respective b×b circulant sub-matrix is $P_{i,j}$, where i denotes a respective row of the array and j denotes a respective column of the array. FIG. 5 illustrates generating a first and an m-th parity segment; however, one skilled in the art will understand how method 500 is enabled to generate the balance of the parity segments.

First, at block 502, encoder 126 is configured to perform multiplication (1,1) via computational unit 208. For multiplication (1,1), computational unit 208 is enabled to multiply b×b circulant sub-matrix $P_{11}$ with corresponding b-sized trunk (1) of information data via $b^2$ concurrent computations (e.g., with $b^2$ AND gates). Next, at block 504, encoder 126 is configured to perform XOR (1,1) via computational unit 208. For XOR (1,1), computational unit 208 is enabled to mathematically combine the results of multiplication (1,1) via b concurrent computations (e.g., with b XOR gates). The intermediate results from XOR (1,1) are stored in intermediate memory 210 at block 516.

At block 506, encoder 126 is configured to perform multiplication (2,1) via computational unit 208. For multiplication (2,1), computational unit 208 is enabled to multiply b×b circulant sub-matrix $p_{21}$ with corresponding b-sized trunk (2) of information data via $b^2$ concurrent computations (e.g., with $b^2$ AND gates). Next, at block 508, encoder 126 is configured to perform XOR (2,1) via computational unit 208. For XOR (2,1), computational unit 208 is enabled to mathematically combine the results of multiplication (2,1) with the intermediate results from XOR (1,1) via b concurrent computations (e.g., with b XOR gates). The intermediate results from XOR (2,1) are stored in intermediate memory 210 at block 516.

At block 510, encoder 126 is configured to perform multiplication (k,1) via computational unit 208. For multiplication (k,1), computational unit 208 is enabled to multiply b×b circulant sub-matrix $P_{k,1}$ with corresponding b-sized trunk (k) of information data via $b^2$ concurrent computations (e.g., with $b^2$ AND gates). Next, at block 512, encoder 126 is configured to perform XOR (k,1) via computational unit 208. For XOR (k,1), computational unit 208 is enabled to mathematically combine the results of multiplication (k,1) with the intermediate results from XOR (k−1,1) via b concurrent computations (e.g., with b XOR gates). The intermediate results from XOR (k,1) are stored in intermediate memory 210 at block 516. The intermediate results from XOR (k,1) are a final result of b bits for the first column of the parity matrix (e.g., a first parity segment $p_1$); thus, at block 514, the final result for the first column of the parity matrix is sent to encoder output buffer 212.

After second sub-operation 507, if k is larger than 3, k−3 additional sub-operations similar to sub-operation 507 are performed (using circulant sub-matrices $P_{3,1}$ through $P_{k-1,1}$) prior to sub-operation 511. Similarly, if m is greater than 2, after sub-operation 511, which completes the encoding computations using the first column of sub-matrices $P_{i=1\ to\ k,1}$, a similar set of k sub-operations is performed for each column of the next m−2 columns of the parity matrix prior to performing a set of k sub-operations (including sub-operations 519, 523, 527) for the last column of the parity matrix.

At block 518, encoder 126 is configured to perform multiplication (1,m) via computational unit 208. For multiplication (1,m), computational unit 208 is enabled to multiply b×b circulant sub-matrix $P_{1,m}$ with corresponding b-sized trunk (1) of information data via $b^2$ concurrent computations (e.g., with $b^2$ AND gates). Next, at block 520, encoder 126 is configured to perform XOR (1,m) via computational unit 208. For XOR (1,1), computational unit 208 is enabled to mathematically combine the results of multiplication (1,m) via b concurrent computations (e.g., with b XOR gates). The intermediate results from XOR (1,m) are stored in intermediate memory 210 at block 516.

At block 522, encoder 126 is configured to perform multiplication (2,m) via computational unit 208. For multiplication (2,m), computational unit 208 is enabled to multiply b×b circulant sub-matrix $P_{2,m}$ with corresponding b-sized trunk (2) of information data via $b^2$ concurrent computations (e.g., with $b^2$ AND gates). Next, at block 524, encoder 126 is configured to perform XOR (2,m) via computational unit 208. For XOR (2,m), computational unit 208 is enabled to mathematically combine the results of multiplication (2,m) with the intermediate results from XOR (1,m) via b concurrent computations (e.g., with b XOR gates). The intermediate results from XOR (2,m) are stored in intermediate memory 210 at block 516.

At block 526, encoder 126 is configured to perform multiplication (k,m) via computational unit 208. For multiplication (k,m), computational unit 208 is enabled to multiply b×b circulant sub-matrix $P_{k,m}$ with corresponding b-sized trunk (k) of information data via $b^2$ concurrent computations (e.g., with $b^2$ AND gates). Next, at block 528, encoder 126 is configured to perform XOR (k,m) via computational unit 208. For XOR (k,m), computational unit 208 is enabled to mathematically combine the results of multiplication (k,m) with the intermediate results from XOR (k−1,m) via b concurrent computations (e.g., with b XOR gates). The intermediate results from XOR (k,m) are stored in intermediate memory 210 at block 516. The intermediate results from XOR (k,m) are a final result of b bits for the m-th column of the parity matrix (e.g., a final parity segment $p_m$); thus, at block 530, the final result for the m-th column of the parity matrix are sent to encoder output buffer 212.

The first parity segment, $p_1$, is generated via k sub-operations for a first column of a respective parity matrix. FIG. 5 illustrates first sub-operation 503 including blocks 502 and 504, second sub-operation 507 including blocks 506 and 508 and k-th (final) sub-operation 511 including blocks 510 and 512 for the first column. Similarly, the m-th (final) parity segment, $P_m$, is generated via k sub-operations for an m-th (final) column of the respective parity matrix. FIG. 5 further illustrates first sub-operation 519 including blocks 518 and 520, second sub-operation 523 including blocks 522 and 524 and k-th (final) sub-operation 527 including blocks 526 and 528 for the m-th (final) column.

Figure 6A:
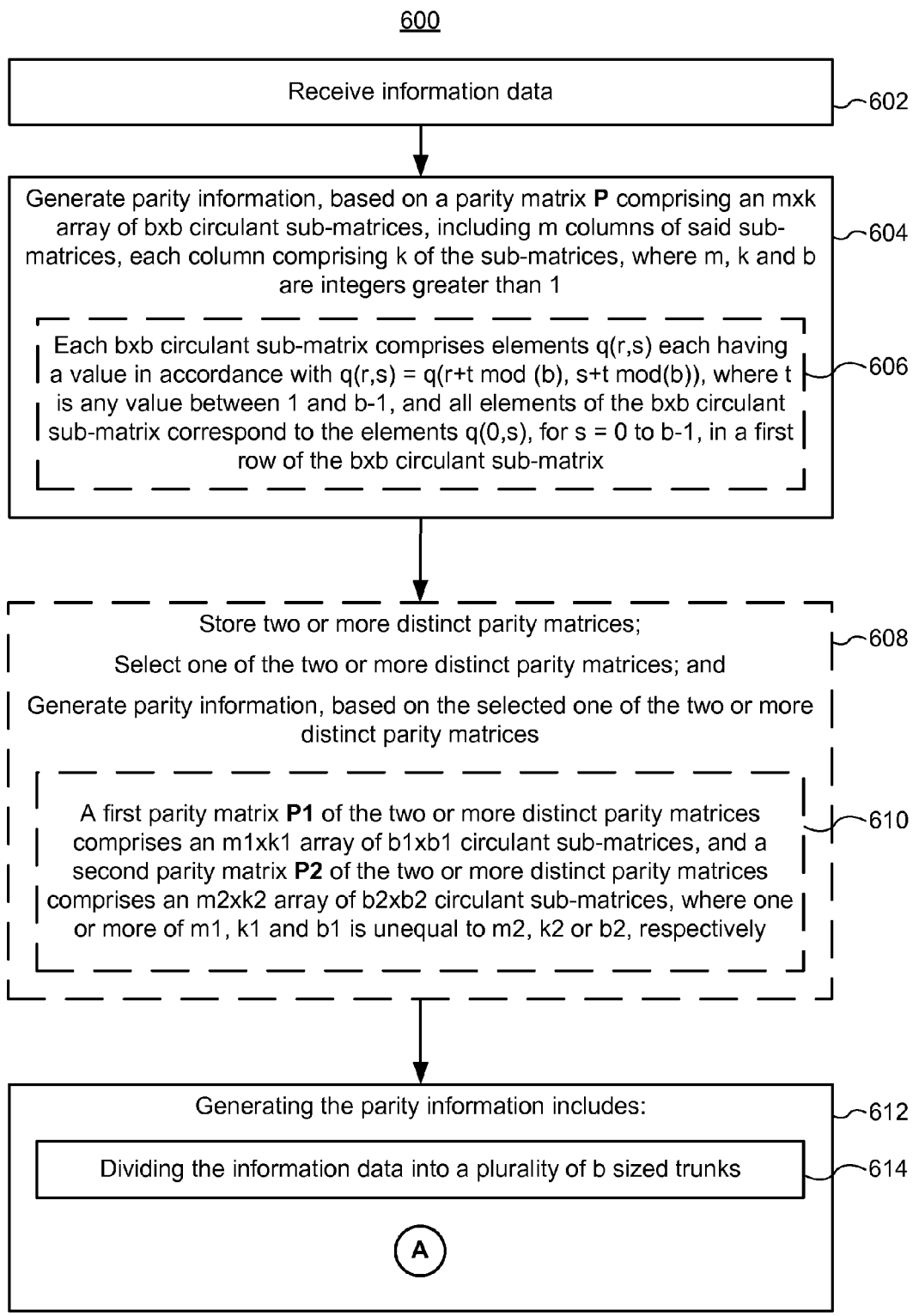
FIGS. 6A-6C are flow diagrams of a method of generating a QC-LDPC codeword, in accordance with some embodiments.
Figure 6B:
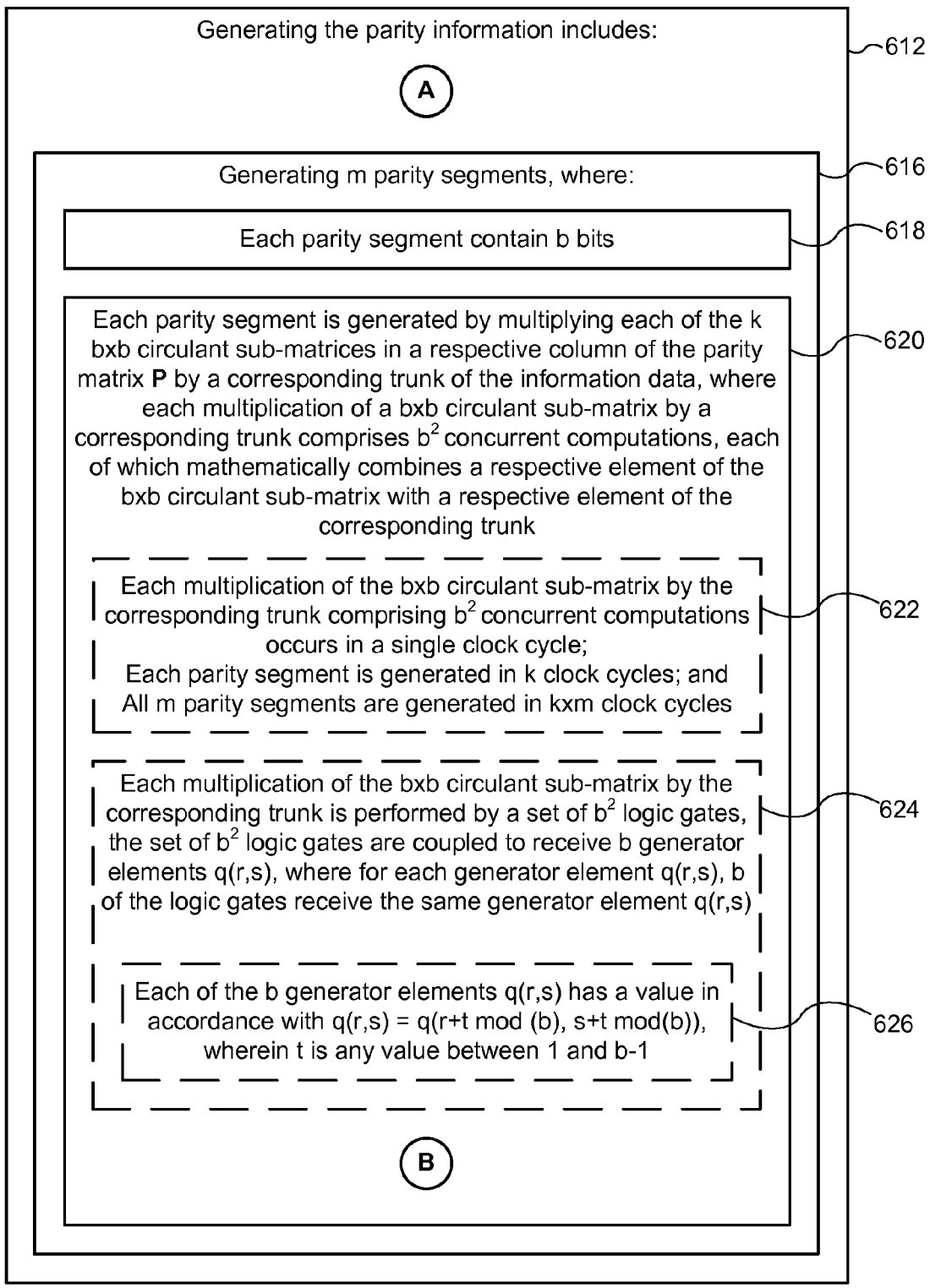
Figure 6C:
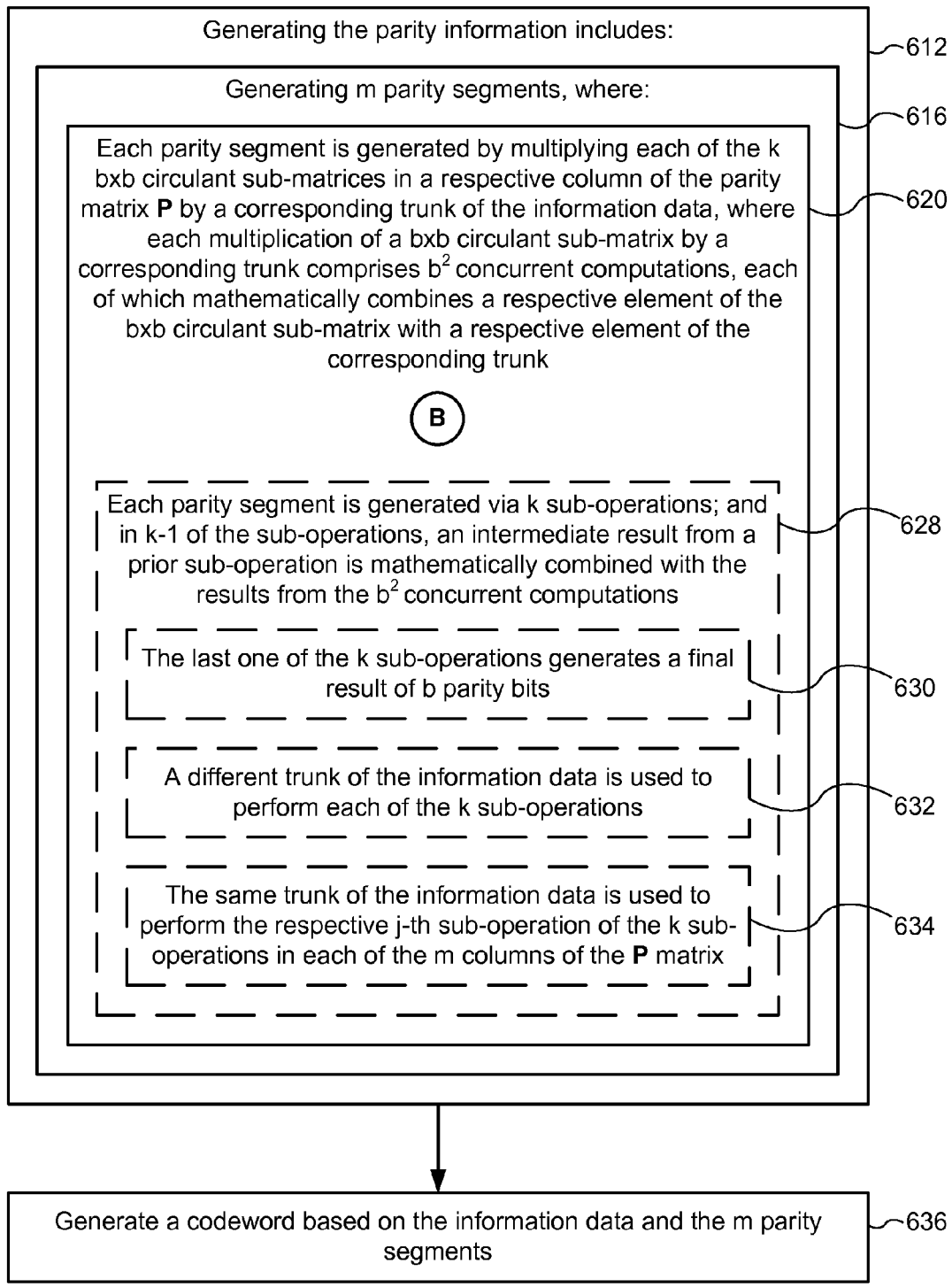

FIG. 6A-6C illustrate a flowchart representation of method 600 of generating a QC-LDPC codeword. In some implementations, method 600 is performed by a memory controller (e.g., memory controller 120) or a component of the memory controller (e.g., encoder 126). In some embodiments, method 600 is governed by instructions that are stored in a computer readable storage medium and that are executed by one or more processors of a device, such as the one or more processing units (CPUs) 122 of management module 121, shown in FIG. 1.

The encoder (602) receives information data. FIG. 2, for example, shows encoder input buffer 204 configured to obtain (e.g., receive or retrieve) information data from input buffer 123.

The encoder generates (604) parity information, based on a parity matrix P comprising an m×k array of b×b circulant sub-matrices, including m columns of said sub-matrices, each column comprising k of the sub-matrices, where m, k and b are integers greater than 1. Alternatively, b is an integer greater than one, either m or k is an integer greater than one, and the other one of m and k is an integer greater than zero. FIG. 2, for example, shows encoder 126 configured to generate parity information based on a parity matrix comprising an m×k array of b×b circulant sub-matrices stored in P-matrix memory 202.

In some embodiments, each b×b circulant sub-matrix comprises (606) elements q(r,s) each having a value in accordance with q(r,s)=q((r+t) mod (b), (s+t) mod (b)), where 0≤t≤b−1, and all elements of the b×b circulant sub-matrix correspond to the elements q(0,s), for 0≤s≤b−1, in a first row of the b×b circulant sub-matrix. Equivalently, all elements of the b×b circulant sub-matrix correspond to the elements q(r, 0), for 0≤r≤b−1, in a first column of the b×b circulant sub-matrix. FIG. 2, for example, shows control logic 206 configured to select b generator elements q(0,s) (or, alternatively q(r, 0)) corresponding to a first row (or, alternatively a first column) of a respective b×b circulant sub-matrix $P_{i,j}$ for a corresponding parity matrix from P-matrix memory 202 to send to computational unit 208.

In some embodiments, the encoder stores (608) two or more distinct parity matrices, selects one of the two or more distinct parity matrices and generates parity information, based on the selected one of the two or more distinct parity matrices. FIG. 2, for example, shows P-matrix memory 202 configured to store two or more distinct parity matrices corresponding to two or more QC-LDPC codes. In this example, control logic 206 is configured to select a respective parity matrix of the two or more distinct parity matrices stored in P-matrix memory 202. For example, control logic 206 selects the respective parity matrix based on the age or the PE count of a respective storage medium or a portion of the respective storage medium (e.g., a distinct die, block zone, block or word line of a memory device). FIG. 2, for example, further shows encoder 126 configured to generate parity information based on the respective parity matrix selected by control logic 206.

In some embodiments, a first parity matrix P1 of the two or more distinct parity matrices comprises (610) an m1×k1 array of b1×b1 circulant sub-matrices and a second parity matrix P2 of the two or more distinct parity matrices comprises an m2×k2 array of b2×b2 circulant sub-matrices, where one or more of m1, k1 and b1 is unequal to m2, k2 or b2, respectively. For example, computational unit 208 comprises $b^2$=144 AND gates; thus, b=12. In this example, each of the two or more distinct matrices (e.g., including P1 and P2) stored in P-matrix memory is constrained by the hardware limitations of computational unit 208 (e.g., b=12).

In this example, the b value for P1 (e.g., b1) must be less than or equal to b (e.g., b1≤b). Similarly, the b value for P2 (e.g., b2) must be less than or equal to b (e.g., b2≤b). In other words, the respective b value for each of the two or more distinct parity matrices stored in P-matrix memory 202 must be less than or equal to the square root of the number of AND gates in computational unit 208 (e.g., b=12 or 144 AND gates). In this example, P1 comprises a 12×49 array (m1=12 and k1=49) of 10×10 circulant sub-matrices (b1=10), and P2 comprises a 15×55 (m2=15 and k2=55) of 12×12 circulant sub-matrices (b2=12). In this example, m1≠m2, k1≠k2 and b1≠b2. Also, b1≤b and b2≤b, in this example; thus, P1 and P2 meet the constraints of computational unit 208.

Generating (612) the parity information includes dividing (614) the information data into a plurality of b-sized trunks. FIG. 2, for example, shows control logic 206 configured to divide the information data stored in encoder input buffer 204 into a plurality of b-sized trunks.

Generating (612) the parity information includes generating (616) m parity segments. FIG. 2, for example, shows encoder 126 configured to generate parity information including m parity segments.

Each parity segment contains (618) b bits. FIG. 5, for example, shows that a final result of b bits (e.g., comprising a first parity segment, $p_1$, of the m parity segments) for a first column of a respective parity matrix is sent to encoder output buffer 212.

The encoder generates (620) each parity segment by multiplying each of the k b×b circulant sub-matrices in a respective column of the parity matrix P by a corresponding trunk of the information data, where each multiplication of a b×b circulant sub-matrix by a corresponding trunk comprises $b^2$ concurrent computations, each of which mathematically combines a respective element of the b×b circulant sub-matrix with a respective element of the corresponding trunk. FIG. 3, for example, shows computational unit 208 (e.g., a component of encoder 126) configured to multiply a respective 4×4 circulant sub-matrix obtained from P-matrix memory 202 (e.g., comprising generator elements q(0,s) for 0≤s≤3 corresponding to a first row of the respective 4×4 circulant sub-matrix) by a corresponding 4-bit trunk of information data (e.g., u(0), u(1), u(2), u(3)) obtained from encoder input buffer 204 via 16 AND gates. In this example, each AND gate mathematically combines a respective element of the respective 4×4 circulant sub-matrix with a respective element of the corresponding 4-bit trunk.

In some embodiments, each multiplication of the b×b circulant sub-matrix by the corresponding trunk comprising $b^2$ concurrent computations occurs (622) in a single clock cycle, each parity segment is generated in k clock cycles and all m parity segments are generated in k−m clock cycles. FIG. 3, for example, shows computational unit 208 configured to perform each multiplication of a 4×4 circulant sub-matrix by a corresponding 4-bit trunk comprising 16 concurrent computations (e.g., via 16 AND gates) in a single clock cycle. FIG. 4, for example, shows that each parity segment is generated in k clock cycles (e.g., parity matrix 410 comprises k circulant sub-matrices in each column). FIG. 4, for example, further shows that all m parity segments are generated in k·m clock cycles (e.g., parity matrix 410 comprises k·m circulant sub-matrices).

In some embodiments, each multiplication of the b×b circulant sub-matrix by the corresponding trunk is performed (624) by a set of $b^2$ logic gates, the set of $b^2$ logic gates are coupled to receive b generator elements q(r,s), where for each generator element q(r,s), b of the logic gates receive the same generator element q(r,s). FIG. 3, for example, shows computational unit 208 configured to perform each multiplication of the 4×4 circulant sub-matrix by a corresponding 4-bit trunk by a set of 16 AND gates. In this example, the set of 16 AND gates are coupled to receive generator elements q(0,s), where 4 AND gates receive the same generator element q(0,s).

In some embodiments, each of the b generator elements q(r,s) has (626) a value in accordance with q(r,s)=q((r+t) mod (b), (s+t) mod (b)), where t is any value between 1 and b−1. FIG. 3, for examples, shows that each of the 4 generator elements q(0,0), q(0,1), q(0,2), q(0,3) has a value in accordance with q(r,s)=q((r+t) mod (b), (s+t) mod(b)), where b=4, t=1, r=0, and 0≤s≤3. In this example, the 4 generator elements comprise a first row of a respective 4×4 circulant sub-matrix, and the 4 generator elements characterize the respective 4×4 circulant sub-matrix.

In some embodiments, the encoder generates (628) each parity segment via k sub-operations, and in k−1 of the sub-operations, the encoder mathematically combines an intermediate result from a prior sub-operation with the results from the $b^2$ concurrent computations. FIG. 5, for example, shows encoder 126 configured to generate a final result of b bits (e.g., a first parity segment) for the first column of a respective parity matrix which is sent to encoder output buffer 512 at block 514. In this example, the first parity segment is generated via k sub-operations comprising first sub-operation 503 (e.g., including multiplication (1,1) 502 and XOR (1,1) 504), second sub-operation 507 (e.g., including multiplication (2,1) 506 and XOR (2,1) 508) and k-th (final) sub-operation 511 (e.g., including multiplication (k,1) 510 and XOR (k,1) 512). FIG. 5, for example, further shows encoder 126 configured to mathematically combine an intermediate result from a prior sub-operation with the results from the $b^2$ concurrent computations for the current sub-operation in k−1 of the sub-operations (e.g., all sub-operations excluding first sub-operation 503). In this example, sub-operation 507 includes XOR (2,1) 508 which mathematically combines an intermediate result from XOR (1,1) 504 (e.g., obtained from intermediate memory 210 at block 516) with the results from multiplication (2,1) 506.

In some embodiments, the last one of the k sub-operations generates (630) a final result of b parity bits. FIG. 5, for example, shows that last sub-operation 511 of the k sub-operations for the first column of a respective parity matrix comprises multiplication (k,1) 510 and XOR (k,1) 512. In this example, last sub-operation 511 generates a final result of b bits for the first column of a respective parity matrix, which is sent to encoder output buffer 212 at block 514.

In some embodiments, a different trunk of the information data is used (632) to perform each of the k sub-operations. FIG. 5, for example, shows that trunk (1) of information data is used for first sub-operation 503 (e.g., including blocks 502 and 504), trunk (2) of the information data is used for second sub-operation 507 (e.g., including blocks 506 and 508) and trunk (k) is used for final sub-operation 511 (e.g., including blocks 510 and 512) in the first column of the respective parity matrix.

In some embodiments, the same trunk of the information data is used (634) to perform the respective j-th sub-operation of the k sub-operations in each of the m columns of the P matrix. FIG. 5, for example, shows that trunk (1) of information data is used to perform the first sub-operation in the first column (e.g., sub-operation 503) and the first sub-operation in the m-th (final) column (e.g., sub-operation 519) for the respective parity matrix.

The encoder generates (636) a codeword based on the information data and the m parity segments. FIG. 2, for examples, shows encoder 126 configured to generate a codeword based on the information data stored in encoder input buffer 204 and the m parity segments stored in the encoder output buffer 212.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

Although the terms "first," "second," etc. may be used above to describe various elements, these elements should not be limited by these terms. These terms are only used to distinguish one element from another. For example, a first trunk could be termed a second trunk, and, similarly, a second trunk could be termed a first trunk, which changing the meaning of the description, so long as all occurrences of the "first trunk" are renamed consistently and all occurrences of the second trunk are renamed consistently. The first trunk and the second trunk are both trunks, but they are not the same trunk.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. A method for generating a QC-LDPC codeword by encoding circuitry, the method comprising: generating parity information, based on a parity matrix P comprising an m×k array of b×b circulant sub-matrices, including m columns of said sub-matrices, wherein m, k and b are integers greater than 1, each column comprising k of the sub-matrices, wherein generating the parity information includes: dividing information data into a plurality of b sized trunks; and generating m parity segments, wherein: each parity segment consists of b bits; and each parity segment is generated by multiplying each of the k b×b circulant sub-matrices in a respective column of the parity matrix P by a corresponding trunk of the information data, wherein each multiplication of a b×b circulant sub-matrix by a corresponding trunk comprises $b^2$ concurrent computations, each of which mathematically combines a respective element of the b×b circulant sub-matrix with a respective element of the corresponding trunk; and generating the codeword to provide error-correction capability based on the information data and the m parity segments.

2. The method of claim 1, wherein each b×b circulant sub-matrix comprises elements q(r,s) each having a value in accordance with q(r,s)=q(r+t mod (b), s+t mod (b)), wherein t is any value between 1 and b−1, and all elements of the b×b circulant sub-matrix correspond to the elements q(0,s), for s=0 to b−1, in a first row of the b×b circulant sub-matrix.

3. The method of claim 1, wherein:
each multiplication of the b×b circulant sub-matrix by the corresponding trunk comprising $b^2$ concurrent computations occurs in a single clock cycle;
each parity segment is generated in k clock cycles; and
all m parity segments are generated in k·m clock cycles.

4. The method of claim 1, wherein:
each parity segment is generated via k sub-operations; and
in k−1 of the sub-operations, an intermediate result from a prior sub-operation is mathematically combined with the results from the $b^2$ concurrent computations.

5. The method of claim 4, wherein the last one of the k sub-operations generates a final result of b parity bits.

6. The method of claim 4, wherein a different trunk of the information data is used to perform each of the k sub-operations.

7. The method of claim 4, wherein the same trunk of the information data is used to perform the respective j-th sub-operation of the k sub-operations in each of the m columns of the P matrix.

8. The method of claim 1, wherein each multiplication of the b×b circulant sub-matrix by the corresponding trunk is performed by a set of $b^2$ logic gates, the set of $b^2$ logic gates are coupled to receive b generator elements q(r,s), wherein for each generator element q(r,s), b of the logic gates receive the same generator element q(r,s).

9. The method of claim 8, wherein each of the b generator elements q(r,s) has a value in accordance with q(r,s)=q(r+t mod (b), s+t mod (b)), wherein t is any value between 1 and b−1.

10. The method of claim 1, further comprising:
storing two or more distinct parity matrices;
selecting one of the two or more distinct parity matrices; and
generating parity information, based on the selected one of the two or more distinct parity matrices.

11. The method of claim 10, wherein a first parity matrix P1 of the two or more distinct parity matrices comprises an m1×k1 array of b1×b1 circulant sub-matrices, and a second parity matrix P2 of the two or more distinct parity matrices comprises an m2×k2 array of b2×b2 circulant sub-matrices, wherein one or more of m1, k1 and b1 is unequal to m2, k2 or b2, respectively.

12. An encoder device for generating a QC-LDPC codeword, the encoder comprising: a P matrix memory configured to store at least one parity matrix P, comprising an m×k array of b×b circulant sub-matrices, including m columns of said sub-matrices, wherein m, k and b are integers greater than 1, each column comprising k of the sub-matrices; an input buffer configured to store information data comprising k·b bits; control logic coupled to the input buffer, the reconfigurable P matrix memory and an output buffer, the control logic configured to divide the information data into a plurality of b-sized trunks; a computational unit configured to generate parity information for the information data, the parity information comprising m parity segments, wherein: each parity segment consists of b bits; and each parity segment is generated by the computation unit by multiplying a respective trunk by each of the k b×b circulant sub-matrices in a respective column of the parity matrix, wherein each multiplication of the respective trunk by a b×b circulant sub-matrix comprises $b^2$ concurrent computations, each of which mathematically combines a respective element of the trunk with a respective element of the b×b circulant sub-matrix; the output buffer configured to store the m parity segments; and the control logic further configured to generate the codeword based on the information data stored in the input buffer and the m parity segments stored in the output buffer.

13. The device of claim 12, wherein each b×b circulant sub-matrix comprises elements q(r,s) each having a value in accordance with q(r,s)=q(r+t mod (b), s+t mod (b)) where t is any value between 1 and b−1, and all elements of the b×b circulant sub-matrix correspond to the elements q(0,s), for s=0 to b−1, in a first row of the b×b circulant sub-matrix.

14. The device of claim 12, wherein:
the computational unit is configured to multiply the b×b circulant sub-matrix by the corresponding trunk in a single clock cycle;
each parity segment is generated in k clock cycles; and
all m parity segments are generated in k–m clock cycles.

15. The device of claim 12, further including an intermediate results register configured to store intermediate results obtained from the computational unit, and
wherein the computational unit is configured to:
generate each parity segment via k sub-operations; and
in k−1 of the sub-operations, mathematically combine an intermediate result from a prior sub-operation stored in the intermediate results register with the results from the $b^2$ concurrent computations.

16. The device of claim 15, wherein the last one of the k sub-operations generates a final result of b parity bits.

17. The device of claim 15, wherein a different trunk of the information data is used to perform each of the k sub-operations.

18. The device of claim 15, wherein the same trunk of the information data is used to perform the respective j-th sub-operation of the k sub-operations in each of the m columns of the P matrix.

19. The device of claim 12, wherein the computational unit comprises a set of $b^2$ logic gates coupled to receive b generator elements q(r,s) from the P-matrix memory, and each multiplication of the b×b circulant sub-matrix by the corresponding trunk is performed by the set of $b^2$ logic gates, wherein for each generator element q(r,s), b of the logic gates receive the same generator element q(r,s).

20. The device of claim 19, wherein each of the b generator elements q(r,s) has a value in accordance with q(r,s)=q(r+t mod (b), s+t mod (b)), wherein t is any value between 1 and b−1.

21. The device of claim 12, wherein:
   the P matrix memory is further configured to store two or more distinct parity matrices;
   the control logic is further configured to select one of the two or more distinct parity matrices; and
   the computational unit is further configured to generate parity information, based on the selected one of the two or more distinct parity matrices.

22. The device of claim 21, wherein a first parity matrix P1 of the two or more distinct parity matrices comprises an m1×k1 array of b1×b1 circulant sub-matrices and a second parity matrix P2 of the two or more distinct parity matrices comprises an m2×k2 array of b2×b2 circulant sub-matrices, wherein one or more of m1, k1 and b1 is unequal to m2, k2 or b2, respectively.

* * * * *